US012426362B2

(12) United States Patent
Zhao et al.

(10) Patent No.: US 12,426,362 B2
(45) Date of Patent: Sep. 23, 2025

(54) LATCH-UP FREE HIGH VOLTAGE DEVICE

(71) Applicant: Halo Microelectronics International, Campbell, CA (US)

(72) Inventors: Lijie Zhao, San Jose, CA (US); Kenneth Chung-Yin Kwok, Irvine, CA (US); Suming Lai, San Diego, CA (US); Zhao Fang, Plano, TX (US)

(73) Assignee: Halo Microelectronics International, Campbell, CA (US)

( * ) Notice: Subject to any disclaimer, the term of this patent is extended or adjusted under 35 U.S.C. 154(b) by 122 days.

(21) Appl. No.: 17/393,875

(22) Filed: Aug. 4, 2021

(65) Prior Publication Data

US 2023/0044360 A1    Feb. 9, 2023

(51) Int. Cl.
*H10D 84/90*    (2025.01)
*H03K 17/0814*    (2006.01)
*H10D 8/01*    (2025.01)
*H10D 8/60*    (2025.01)
*H10D 84/01*    (2025.01)
*H10D 84/03*    (2025.01)
*H10D 84/40*    (2025.01)
*H10D 84/85*    (2025.01)

(52) U.S. Cl.
CPC ....... *H10D 84/991* (2025.01); *H03K 17/0814* (2013.01); *H10D 8/051* (2025.01); *H10D 8/60* (2025.01); *H10D 84/0109* (2025.01); *H10D 84/038* (2025.01); *H10D 84/403* (2025.01); *H10D 84/854* (2025.01)

(58) Field of Classification Search
CPC ............ H01L 27/0629; H01L 27/0255; H01L 27/0262; H01L 29/7802; H01L 27/0259
See application file for complete search history.

(56) References Cited

U.S. PATENT DOCUMENTS

| | | | | |
|---|---|---|---|---|
| 6,303,444 B1* | 10/2001 | Burr | ..................... | H01L 27/0921 257/E27.035 |
| 10,636,872 B1* | 4/2020 | Chang | ................... | H01L 29/872 |
| 2006/0094205 A1* | 5/2006 | Dakshina-Murthy | ........................ | H01L 21/76224 257/E21.546 |
| 2006/0186507 A1* | 8/2006 | Kanda | ................. | H01L 29/1083 257/E29.268 |
| 2011/0241113 A1* | 10/2011 | Zuniga | ................ | H01L 29/7816 257/E29.261 |
| 2012/0112276 A1* | 5/2012 | Lee | ................... | H01L 29/66681 257/E29.256 |
| 2012/0199905 A1* | 8/2012 | Nitta | ................. | H01L 29/41758 257/E29.256 |
| 2013/0270606 A1* | 10/2013 | Chen | ................... | H01L 29/0626 257/E21.409 |
| 2014/0001549 A1* | 1/2014 | Bode | ................... | H01L 29/7835 438/478 |
| 2014/0084386 A1* | 3/2014 | Takeda | ............. | H01L 29/66462 257/408 |
| 2015/0325639 A1* | 11/2015 | Liao | ..................... | H03K 17/687 327/434 |
| 2017/0179306 A1* | 6/2017 | Hsiao | ...................... | H01L 29/872 |

* cited by examiner

*Primary Examiner* — Feifei Yeung Lopez
(74) *Attorney, Agent, or Firm* — AP3 Law Firm, PLLC

(57) ABSTRACT

An apparatus includes a first drain/source region and a second drain/source region surrounded by an isolation ring formed over a substrate, the isolation ring formed being configured to be floating, and a first diode connected between the substrate and the isolation ring, wherein the first diode is a Schottky diode.

17 Claims, 7 Drawing Sheets

LATCH-UP FREE HIGH VOLTAGE DEVICE

TECHNICAL FIELD

The present invention relates to a load switch, and, in particular embodiments, to a latch-up free load switch including a pair of back-to-back connected transistors.

BACKGROUND

As semiconductor technologies further advance, metal oxide semiconductor field effect transistor (MOSFET) devices have been widely used in integrated circuits. MOSFETs are voltage controlled devices. When a control voltage is applied to the gate of a MOSFET and the control voltage is greater than the threshold of the MOSFET, a conductive channel is established between the drain and the source of the MOSFET. After the conductive channel has been established, a current flows between the drain and the source of the MOSFET. On the other hand, when the control voltage applied to the gate is less than the threshold of the MOSFET, the MOSFET is turned off accordingly.

A load switch is employed to connect a first electronic apparatus (e.g., a load) to a second electronic apparatus (e.g., a power supply) or disconnect the first electronic apparatus from the second electronic apparatus. The load switch may be controlled by an external control signal. In operation, when the load switch is turned off, the load switch is capable of blocking current from flowing in both directions. On the other hand, when the load switch is turned on, a conductive path is established between the first electronic apparatus and the second electronic apparatus. The load switch may be implemented as an isolation switch having two back-to-back connected transistors. The back-to-back connected transistors are able to achieve bidirectional current blocking.

A load switch may comprise a plurality of N-type regions and P-type regions. The N-type regions and P-type regions of the load switch may form a PNP bipolar transistor and an NPN bipolar transistor. Both bipolar transistors are parasitic transistors. The NPN bipolar transistor and the PNP bipolar transistor of the load switch can form a thyristor having the PNP bipolar transistor stacked over the NPN bipolar transistor. If one of the parasitic transistors is inadvertently turned on, latch-up can occur. Once the load switch is in latch-up, the load switch may be damaged by the excessive power dissipation caused by a large leakage current. Latch-up is a highly undesirable operating condition. It is desirable to have a simple and reliable circuit to avoid latch-up.

SUMMARY

These and other problems are generally solved or circumvented, and technical advantages are generally achieved, by preferred embodiments of the present disclosure which provide a latch-up free load switch including a pair of back-to-back connected transistors.

In accordance with an embodiment, an apparatus comprises a first drain/source region and a second drain/source region surrounded by an isolation ring formed over a substrate, the isolation ring formed being configured to be floating, and a first diode connected between the substrate and the isolation ring, wherein the first diode is a Schottky diode.

In accordance with another embodiment, a method comprises growing an epitaxial layer with a first conductivity type on a substrate with the first conductivity type, forming an isolation ring with a second conductivity type in the epitaxial layer, the isolation ring comprising a buried layer, a plurality of first regions and a plurality of second regions, forming a first drain/source region and a second drain/source region in the isolation ring, and forming a first Schottky diode over the substrate, wherein an anode of the first Schottky diode is a metal contact connected to the substrate, and a cathode of the first Schottky diode is a region with the second conductivity type connected to the isolation ring.

In accordance with yet another embodiment, a load switch comprises a first transistor, and a second transistor being back-to-back connected to the first transistor, wherein a drain of the first transistor, a drain of the second transistor and a shared source are formed over a substrate and within an isolation ring, the isolation ring being configured to be floating, and a first Schottky diode connected between the substrate and the isolation ring.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a latch-up free load switch including a pair of back-to-back connected metal oxide semiconductor field effect transistor (MOSFET) devices. The embodiments of the disclosure may also be applied to a variety of semiconductor devices. Hereinafter, various embodiments will be explained in detail with reference to the accompanying drawings.

Figure 1:
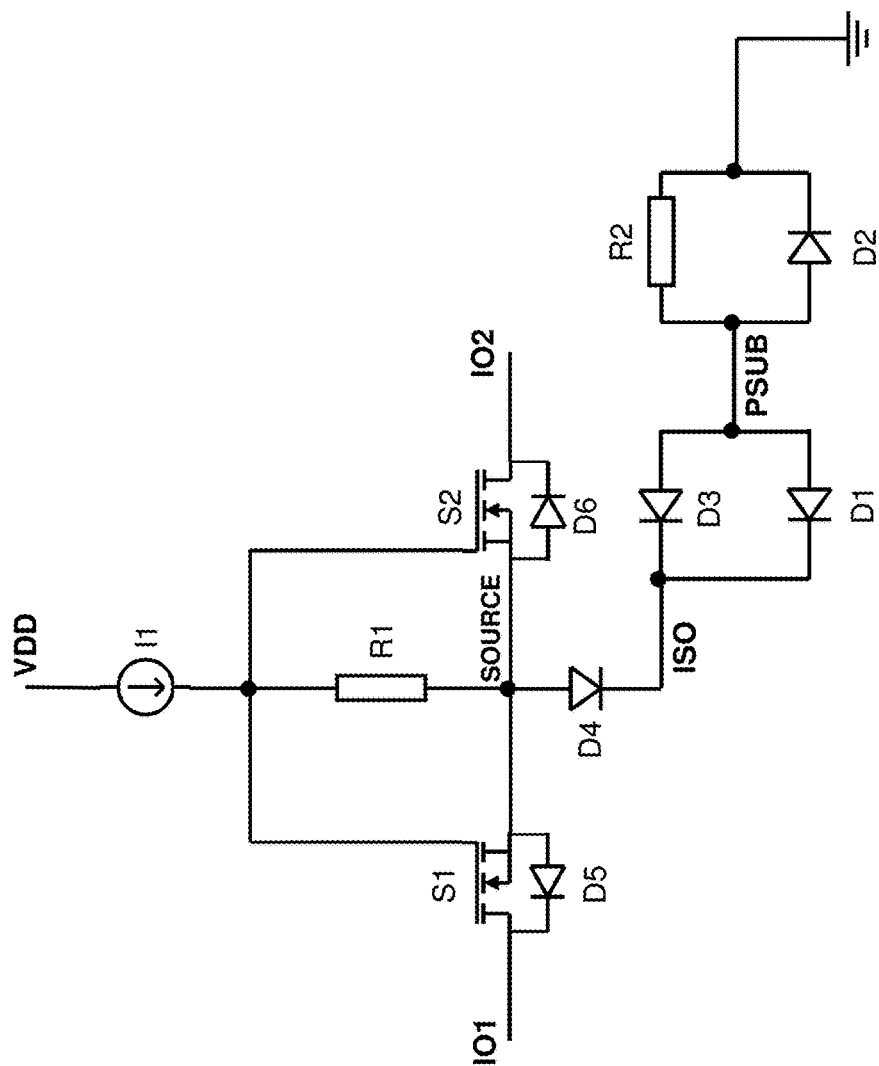
FIG. 1 illustrates a schematic diagram of a load switch comprising shared-source transistors in accordance with various embodiments of the present disclosure.

FIG. 1 illustrates a schematic diagram of a load switch comprising shared-source transistors in accordance with various embodiments of the present disclosure. The load switch may be implemented as two back-to-back connected MOSFET devices. These two MOSFET devices share a source. Throughout the description, the load switch may be alternatively referred to as shared-source transistors.

As shown in FIG. 1, the load switch comprise two back-to-back connected N-type MOSFET devices. A first MOSFET device S1 has a drain connected to a first input/output terminal IO1. A second MOSFET device S2 has a drain connected to a second input/output terminal IO2. A gate of the first MOSFET device S1 is connected to a gate of the second MOSFET device S2 and further connected to a bias voltage source VDD through a current source I1. A source of the first MOSFET device S1 is directly connected to a source of the second MOSFET device S2. In other words, the first MOSFET device S1 and the second MOSFET device S2 share a common source. As shown in FIG. 1, a resistor R1 is connected between the gates of the two MOSFET devices and the common source.

In some embodiments. The bias voltage source VDD has an output voltage greater than the voltage on the common source. The bias voltage source VDD can be established by a suitable bias circuit such as a charge pump, a boot strap and the like. The current source I1 is a controllable current source. R1 is a gate to source resistor. The voltage across R1 (I1×R1) is a gate voltage used to control the on and off of the load switch.

The shared-source transistors shown in FIG. 1 can be used as a load switch. The load switch is able to achieve bidirectional current blocking. As such, the load switch is also known as an isolation switch.

In some embodiments, the two back-to-back connected N-type MOSFET devices are formed in an isolation ring (ISO) over a substrate. In some embodiments, the substrate is a P-type substrate (shown in FIG. 4). The isolation ring comprises an N-type buried layer and two N-type sidewalls (shown in FIG. 4). The isolation ring is configured to isolate the P-type bulk (e.g., DPW shown in FIG. 4) from the P-type substrate.

A diode D4 is formed between the common source and the isolation ring. As shown in FIG. 1, an anode of the diode D4 is connected to the common source. A cathode of the diode D4 is connected to the isolation ring. Furthermore, a diode D3 is formed between the P-type substrate (PSUB) and the isolation ring. As shown in FIG. 1, an anode of the diode D3 is connected to the PSUB. A cathode of the diode D3 is connected to the isolation ring. A diode D5 is formed between the common source and the drain of the first MOSFET device S1. A diode D6 is formed between the common source and the drain of the second MOSFET device S2. It should be noted that D3, D3, D5 and D6 are parasitic didoes formed by various device P/N junctions of the load switch.

The load switch further comprises two Schottky diodes and a parasitic resistance component. As shown in FIG. 1, a first Schottky diode D1 is connected between PSUB and the isolation ring. In some embodiments, an anode of the first Schottky diode D1 is a metal contact. The metal contact of the first Schottky diode D1 is connected to a metal contact of PSUB through a suitable semiconductor interconnect device (e.g., a plurality of metal lines and vias). A cathode of the first Schottky diode D1 is an N-type region (e.g., HDNW 210 shown in FIG. 5) connected to the isolation ring. The detailed structure of the first Schottky diode D1 will be described below with respect to FIG. 5.

A second Schottky diode D2 is connected between PSUB and ground (e.g., a ground plane). In some embodiments, an anode of the second Schottky diode D2 is a metal contact. The metal contact of the second Schottky diode D2 is connected to a metal contact of PSUB through a suitable interconnect device (e.g., a plurality of metal lines and vias). A cathode of the second Schottky diode D2 is an N-type region connected to the ground plane through a suitable interconnect device (e.g., a plurality of metal lines and vias). The detailed structure of the second Schottky diode D2 will be described below with respect to FIG. 5.

The parasitic resistance component is denoted as a resistor R2 connected between PSUB and ground. R2 represents the parasitic resistance from the substrate of the load switch to the ground plane to which a plurality of substrates is connected. In some embodiments, the substrate underneath the load switch is not directly connected to the ground plane. The substrate underneath the load switch is connected to the ground plane through a plurality of P-type regions and suitable interconnect devices (e.g., a plurality of metal lines and vias). The plurality of P-type regions and suitable interconnect devices are arranged such that the parasitic resistance from the substrate of the load switch to ground is greater than 1 Kilo-ohms.

In operation, the drain of the first MOSFET device S1 may be connected to an ac power source such as a terminal of a receiver coil. In some embodiments, the voltage fed into the drain of the first MOSFET device S1 is in a range from about −40 V to about 40 V. The drain of the second MOSFET device S2 may be connected to a receiver apparatus such as a rectifier. In this configuration, the load switch may be controlled by the voltage across R1 (I1×R1). In operation, when the load switch is turned off, the load switch is able to block current from flowing in both directions. On the other hand, when the load switch is turned on through applying a gate to source voltage (I1×R1) greater than the threshold voltage (e.g., 0.7 V), a conductive path is established between IO1 and IO2. Through the conductive path, the current flows through the load switch.

In operation, the isolation ring is configured to be floating. In other words, the isolation ring is not connected to any power sources (e.g., VDD). As a result of not being connected to any power sources, the isolation ring does not have strong current driving capability. As such, the isolation ring is not sensitive to the variation of the parasitic resistance. PSUB is not directly connected to ground either. Instead, PSUB is connected to ground through the parasitic resistor R2. In other words, PSUB is weakly coupled to ground. The first Schottky diode D1 is used to prevent latch-up from occurring through interrupting the positive feedback in a thyristor formed in the load switch. The floating isolation ring (ISO) prevents excessive current and heat generation when the IO1/IO2 is configured to receive an excessively negative potential (e.g., −40 V). Furthermore, the floating isolation ring (ISO) prevents the NPN transistor formed by D4 and D5 from being inadvertently turned on. The second Schottky diode D2 functions as a clamping diode. If a positive voltage greater than a forward diode voltage drop (e.g., 0.3 V or 0.4 V) occurs at PSUB, the second Schottky diode D2 is capable of preventing the voltage at PSUB from going more than one forward diode voltage drop. This prevents the weakly grounded PSUB from bouncing too high in the positive voltage direction, thereby preventing the circuit that depends on the PSUB potential as a reference from malfunctioning.

It should be noted that the load switch shown in FIG. 1 is formed by two N-type MOSFET devices. One advantageous feature of having the N-type MOSFET devices is the N-type MOSFET device has a low on resistance in comparison with a P-type MOSFET device similar in size. Furthermore, the control circuit of the N-type MOSFET device is simple and robust, thereby improving the reliability of the load switch.

Figure 2:
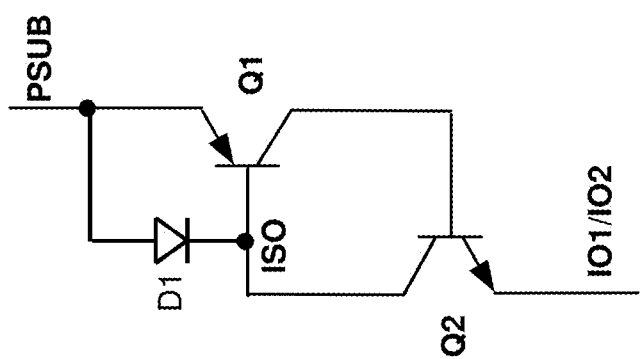
FIG. 2 illustrates a schematic diagram of a parasitic structure formed in the load switch shown in FIG. 1 in accordance with various embodiments of the present disclosure.

FIG. 2 illustrates a schematic diagram of a parasitic structure formed in the load switch shown in FIG. 1 in accordance with various embodiments of the present disclosure. The parasitic structure comprises a PNP transistor Q1 and an NPN transistor Q2 stacked next to each other. Referring back to FIG. 1, the PNP transistor Q1 is formed by the parasitic diodes D3 and D4, and the NPN transistor Q2 is formed by the parasitic diodes D4 and D5/D6. The emitter of Q1 is connected to PSUB. The base of Q1 is connected to the isolation ring. The emitter of Q2 is connected to IO1 and/or IO2. The collector of Q1 and the base of Q2 are connected to the common source node of the two N-type MOSFET devices. The parasitic structure shown in FIG. 2 is equivalent to a thyristor.

Figure 7:
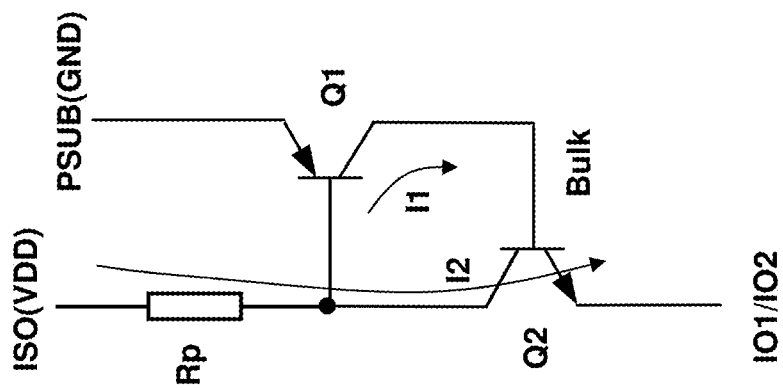
FIG. 7 illustrates a schematic diagram of a parasitic structure formed in a conventional load switch.

FIG. 7 illustrates a schematic diagram of a parasitic structure formed in a conventional load switch design. In the conventional design, in order to prevent latch up, the isolation ring is always connected to the highest potential of the circuit (e.g., VDD) where the load switch is located while the substrate (PSUB) is always connected to ground (GND). However, in the target application of the load switch of the present disclosure, the input of the load switch at IO1/IO2 terminal is configured to receive an excessive negative voltage up to −40 V. In this case, grounding PSUB and tying ISO to VDD can no longer provide sufficient protection against latch-up. For example, when a perturbation in the circuit generates a minute current I1 flowing from the collector of Q1 to the base of the Q2, it will allow current I2 to be generated between the collector and emitter of Q2. As shown in FIG. 7, the emitter of Q2 is connected to IO1/IO2 that is configured to receive excessive negative voltages. The ISO is connected to a power source (e.g., VDD) that has strong driving capability. The induced current I2 is able to pull the base of Q1 down to a voltage potential lower than GND. Such a voltage potential exceeds the turn-on voltage threshold of the PN junction (D3). As a result, a higher current I1 is generated. The higher current is fed into the base of Q2. While ISO is tied to the power source (e.g., VDD), a higher based current fed into Q2 will induce a higher current I2 through Q2 to form a positive feedback. This positive feedback increases the current flowing through Q1 and Q2 until the excessive power dissipation damages the load switch. This phenomenon is known as latch-up.

In order to prevent latch-up from happening, the first Schottky diode D1 is connected between PSUB and the isolation ring. The first Schottky diode D1 is used to degenerate Q1. In particular, the first Schottky diode D1 has a forward voltage drop (e.g., 0.4 V) less than the forward voltage drop (e.g., 0.6 V) from the emitter to the base ($V_{BE}$). The low forward voltage drop of D1 helps to bypass the current flowing through $V_{BE}$ of Q1 so as to prevent Q1 from being turned on, thereby interrupting the positive feedback in the thyristor. As a result of interrupting the positive feedback in the thyristor, the latch-up does not happen. The integrated circuit where the load switch is located is protected from being damaged.

Referring back to FIG. 1, the first Schottky diode D1 is connected between PSUB and the isolation ring. The first Schottky diode D1 and the parasitic diode D3 are connected in parallel. D1 is used to bypass the current flowing through the parasitic diode D3 because the forward voltage drop of the first Schottky diode D1 is much less than that of the parasitic diode D3. D3 is formed from the P/N junction of $V_{BE}$ of Q1 shown in FIG. 2. Through bypassing the current flowing through $V_{BE}$, the first Schottky diode D1 helps to prevent latch-up from occurring. In order to further reduce the heat generation while Q2 is inadvertently turned on, the ISO can be configured to be floating. For example, the ISO is disconnected from the power source VDD. Without having a connection to a power source with strong current driving capability, even when IO1/IO2 is configured to receive excessive negative voltages, Q2, which is inadvertently turned on, is not going to generate a high current flowing through Q2, thus preventing Q2 from generating excessive heat. Optionally, with D1 in parallel with the emitter-base junction of Q1, when IO1/IO2 is configured to receive excessive negative voltages and Q2 is inadvertently turned on, PSUB is able to provide a high current fed into Q2 through the Schottky diode D1 if PSUB is connected to ground directly. In order to prevent this high current, PSUB is coupled to ground through a weak connection, thus allowing PSUB to be pulled down to a negative voltage through D1, thus reducing the current flowing through Q2 when Q2 is inadvertently turned on.

Figure 3:
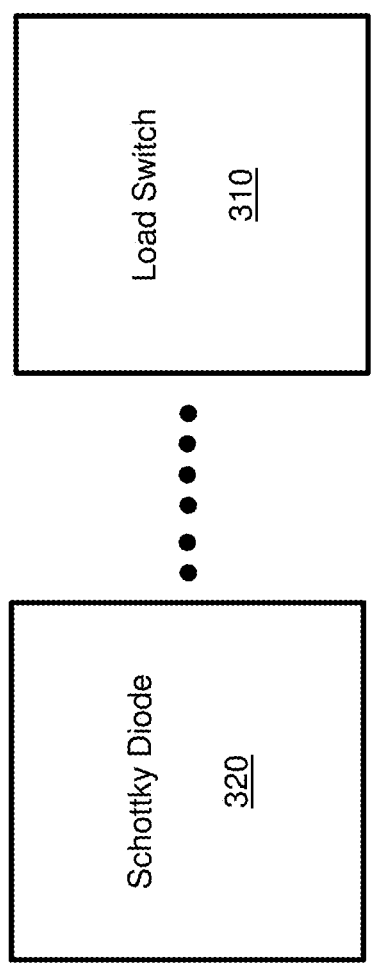
FIG. 3 illustrates a block diagram of a latch-up free load switch apparatus in accordance with various embodiments of the present disclosure.

FIG. 3 illustrates a block diagram of a latch-up free load switch apparatus in accordance with various embodiments of the present disclosure. The latch-up free load switch apparatus comprises a load switch 310 and a plurality of Schottky diodes 320 (e.g., D1 shown in FIG. 1). The load switch 310 comprises a first drain/source region, a second drain/source region and a third drain/source region surrounded by an isolation ring (ISO) formed over a substrate. The load switch 310 further comprises a first gate formed between the first drain/source region and the third drain/source region, and a second gate formed between the second drain/source region and the third drain/source region.

The first drain/source region is a first drain of two back-to-back connected transistors. The second drain/source region is a second drain of the two back-to-back connected transistors. The third drain/source region is a shared source of the two back-to-back connected transistors.

A first Schottky diode 320 is connected between the substrate and the isolation ring. An anode of the first Schottky diode 320 is connected to the substrate. A cathode of the first Schottky diode 320 is connected to the isolation ring. The first Schottky diode 320 is formed by a metal contact and an N-type region. The first Schottky diode 320 is arranged to prevent the apparatus from entering a latch-up operating condition as described above with respect to FIG. 2.

The latch-up free load switch apparatus further comprises a second Schottky diode 320 connected between the substrate and ground. An anode of the second Schottky diode 320 is connected to the substrate. A cathode of the second Schottky diode 320 is connected to ground. The latch-up free load switch apparatus further comprises a resistor (e.g., R2 shown in FIG. 1) connected in parallel with the second Schottky diode 320. The resistor is a parasitic component having a parasitic resistance value determined by a layout of the substrate. The combination of the diode D2 and the parasitic resistor R2 allows PSUB to be weakly coupled to GND, thereby allowing it to be pulled down to a negative potential close to the negative potential of IO1/IO2. By using the diode D2, PSUB is not able to "bounce" higher more than one Schottky diode drop with respect to GND. This arrangement limits the current flow through Q2 even when Q2 is inadvertently turned on, while still keeping PSUB from "bouncing" to an excessive positive voltage, which may cause the rest of the system to malfunction.

Figure 4:
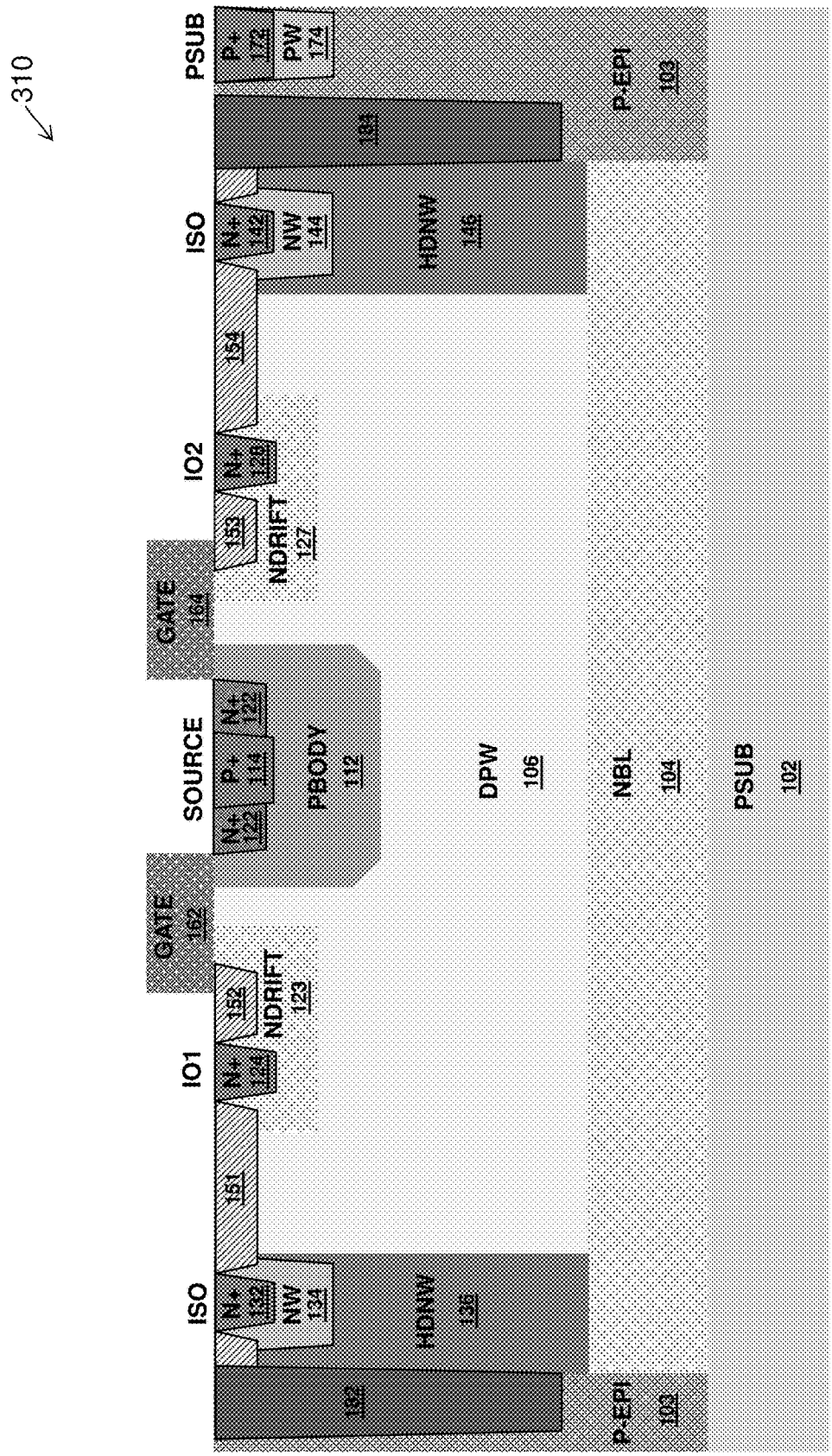
FIG. 4 illustrates a simplified cross-sectional view of a load switch of the latch-up free load switch apparatus shown in FIG. 3 in accordance with various embodiments of the present disclosure.

FIG. 4 illustrates a simplified cross-sectional view of a load switch of the latch-up free load switch apparatus shown in FIG. 3 in accordance with various embodiments of the present disclosure. The load switch comprises a substrate 102, an epitaxial layer 103, an isolation ring, a deep well 106, a first drift layer 123 and a second drift layer 127 formed in the deep well 106, a body region 112 formed in the deep well 106. The load switch further comprise a first drain/source region 124 formed in the first drift layer 123, a second drain/source region 128 formed in the second drift layer 127, a third drain/source region 122, a first gate 162 and a second gate 164.

The isolation ring comprises a bottom, a first sidewall and a second sidewall. The bottom is a buried layer 104. The first sidewall comprises a plurality of first regions 132, 134 and 136 stacked over each other. The second sidewall comprises a plurality of second regions 142, 144 and 146 stacked over each other. In each sidewall, the concentration of the dopants varies from a place of higher concentration (e.g., region 132) to a place of lower concentration (e.g., region 136). The change in the concentration develops a gradient. Due to this gradient, a stable electric field is formed in the gradient doping regions, thereby increasing the breakdown voltage of the load switch.

The load switch further comprises a plurality of isolation region including shallow trench isolation regions 151, 152, 153 and 154, deep trench isolation regions 182 and 184. These isolation regions are employed to prevent leakage currents flowing between adjacent semiconductor regions.

The load switch further comprises a plurality of substrate contact regions 172 and 174. The substrate contact regions 172, 174 and the epitaxial layer 103 form a conductive channel between the substrate 102 and exterior circuits.

In some embodiments, the substrate 102, the epitaxial layer 103, the deep well 106, the body region 112, and substrate contact regions 172, 174 have a first conductivity type. The buried layer 104, the first drift layer 123, the second drift layer 127, the first drain/source region 124, the second drain/source region 128, the third drain/source region 122, the plurality of first regions 132, 134 and 136 and the plurality of second regions 142, 144 and 146 have a second conductivity type. In some embodiments, the first conductivity type is P-type, and the second conductivity type is N-type. The load switch is formed by two n-type transistors. Alternatively, the first conductivity type is N-type, and the second conductivity type is P-type. The load switch is formed by two p-type transistors.

The substrate 102 may be formed of suitable semiconductor materials such as silicon, silicon germanium, silicon carbide and the like. Depending on different applications and design needs, the substrate 102 may be N-type or P-type. In some embodiments, the substrate 102 is a P-type substrate. Appropriate P-type dopants such as boron and the like are doped into the substrate 102. Alternatively, the substrate 102 is an N-type substrate. Appropriate N-type dopants such as phosphorous and the like are doped into the substrate 102.

The load switch is formed in a wafer. The load switch may comprise a plurality of circuits. Each circuit is formed over a substrate. All substrates are connected together to a common node of the wafer where the load switch is formed. The common node may be connected to a ground plane.

The epitaxial layer 103 may be implemented as a P-type epitaxial layer. Throughout the description, the epitaxial layer 103 may be alternatively referred to as the P-EPI layer 103. The epitaxial layer 103 is grown from the substrate 102. The epitaxial growth of the P-type epitaxial layer 103 may be implemented by using any suitable semiconductor fabrication processes such as chemical vapor deposition (CVD) and the like.

The buried layer 104 is an N-type buried layer. The buried layer 104 is deposited over the substrate 102 for isolation purposes. The buried layer 104 is a bottom of the isolation ring, which is employed to prevent the current from flowing into the substrate 102, thereby avoiding the leakage in the load switch.

A first sidewall of the isolation ring comprises regions 132, 134 and 136. The region 136 is a high density N-type well (HDNW). The HDNW 136 may be formed by implanting n-type doping materials such as phosphor and the like. Alternatively, the HDNW 136 can be formed by a diffusion process. The region 134 is an N-type well (NW). The NW 134 may be formed by implanting n-type doping materials such as phosphor and the like. Alternatively, the NW 134 can be formed by a diffusion process. The region 132 is an N+ region. The N+ region 132 is formed in the NW 134. The N+ region 132 may be formed by implanting N-type doping materials such as phosphor and the like. The formation of regions 142, 144 and 146 are similar to regions 132, 134 and 136 respectively, and hence is not discussed in detail.

The deep well 106 is surrounded by the isolation ring. The deep well 106 is a deep P-type well (DPW). The DPW 106 may be formed by implanting p-type doping materials such as boron and the like. Alternatively, the DPW 106 can be formed by a diffusion process.

The first drift layer 123 and the second drift layer 127 are N-type layers formed in the DPW 106. In some embodiments, the first drift layer 123 and the second drift layer 127 may be doped with an N-type dopant such as phosphorous.

The body region 112 is a P-type body (PBODY) region. The P-type body region may be formed by implanting P-type doping materials such as boron and the like. Alternatively, the P-type body region can be formed by a diffusion process.

The first drain/source region 124 is an N+ region formed in the first drift layer 123. In accordance with an embodiment, the first drain/source region 124 functions as a first drain region of the shared-source transistors. The first drain region may be formed by implanting N-type dopants such as phosphorous. Furthermore, a first drain contact (not shown) is formed over the first drain/source region 124. The first drain contact corresponds to IO1 shown in FIG. 1.

The second drain/source region 128 is an N+ region formed in the second drift layer 127. In accordance with an embodiment, the second drain/source region 128 functions as a second drain region of the shared-source transistors. The second drain region may be formed by implanting N-type dopants such as phosphorous. Furthermore, a second drain contact (not shown) is formed over the second drain/source region 128. The second drain contact corresponds to IO2 shown in FIG. 1.

The third drain/source region 122 is an N+ region formed in the body region 112. In accordance with an embodiment, the third drain/source region 122 functions as a common source of the shared-source transistors. The common source may be formed by implanting N-type dopants such as phosphorous. Furthermore, a source contact (not shown) is formed over the third drain/source region 122. The source contact corresponds to SOURCE shown in FIG. 1.

It should be noted that a P+ region 114 is formed adjacent to the common source in the body region 112. The P+ region 114 may be formed by implanting a P-type dopant such as boron. The P+ region 114 may contact the P-type body region 112. In order to eliminate the body effect, the P+ region may be connected to the common source directly through the source contact.

The first gate 162 is formed between the first drain/source region 124 and the third drain/source region 122. As shown in FIG. 4, a first portion of the first gate 162 is over the STI 152. A second portion of the first gate 162 is over the first drift layer 123. A third portion of the first gate 162 is over the DPW 106. A fourth portion of the first gate 162 is over the body region 112. The first gate 162 may be formed of polysilicon, polysilicon germanium, nickel silicide or other metal, metal alloy materials.

The second gate 164 is formed between the second drain/source region 128 and the third drain/source region 122. As shown in FIG. 4, a first portion of the second gate 164 is over the STI 153. A second portion of the second gate 164 is over the second drift layer 127. A third portion of the second gate 164 is over the DPW 106. A fourth portion of the second gate 164 is over the body region 112. The second gate 164 may be formed of polysilicon, polysilicon germanium, nickel silicide or other metal, metal alloy materials.

Referring back to FIG. 1, the diode D3 shown in FIG. 1 is formed between the substrate 102 and the isolation ring. In particular, an anode of the diode D3 is formed in the substrate 102. A cathode of the diode D3 is formed in the buried layer 104. The diode D4 shown in FIG. 1 is formed between the buried layer 104 and the deep well 106. In particular, an anode of the diode D4 is formed in the deep well 106. A cathode of the diode D4 is formed in the buried layer 104.

The diode D5 shown in FIG. 1 is formed between the body region 112 and the first drift layer 123. In particular, an anode of the diode D5 is formed in the body region 112. A cathode of the diode D5 is formed in the first drift layer 123. The diode D6 shown in FIG. 1 is formed between the body region 112 and the second drift layer 127. In particular, an anode of the diode D6 is formed in the body region 112. A cathode of the diode D6 is formed in the second drift layer 127.

It should noted that while FIG. 4 shows a load switch comprising two back-to-back connected transistors, the various embodiments of the present disclosure are also applicable to one single transistor. For example, one transistor is formed by a plurality of transistor cells. The N+ region 124 is a drain of a first transistor cell. The N+ region 128 is a drain of a second transistor cell. The drain of the first transistor cell is connected to the drain of the second transistor cell through a suitable interconnect device. Likewise, the gate 162 is a gate of the first transistor cell. The gate 164 is a gate of the second transistor cell. The gate of the first transistor cell is connected to the gate of the second transistor cell through a suitable interconnect device. The latch-up free structure (D1, D2 and R2) helps to prevent the single transistor from entering a latch-up operating condition as described above with respect to FIG. 2.

Figure 5:
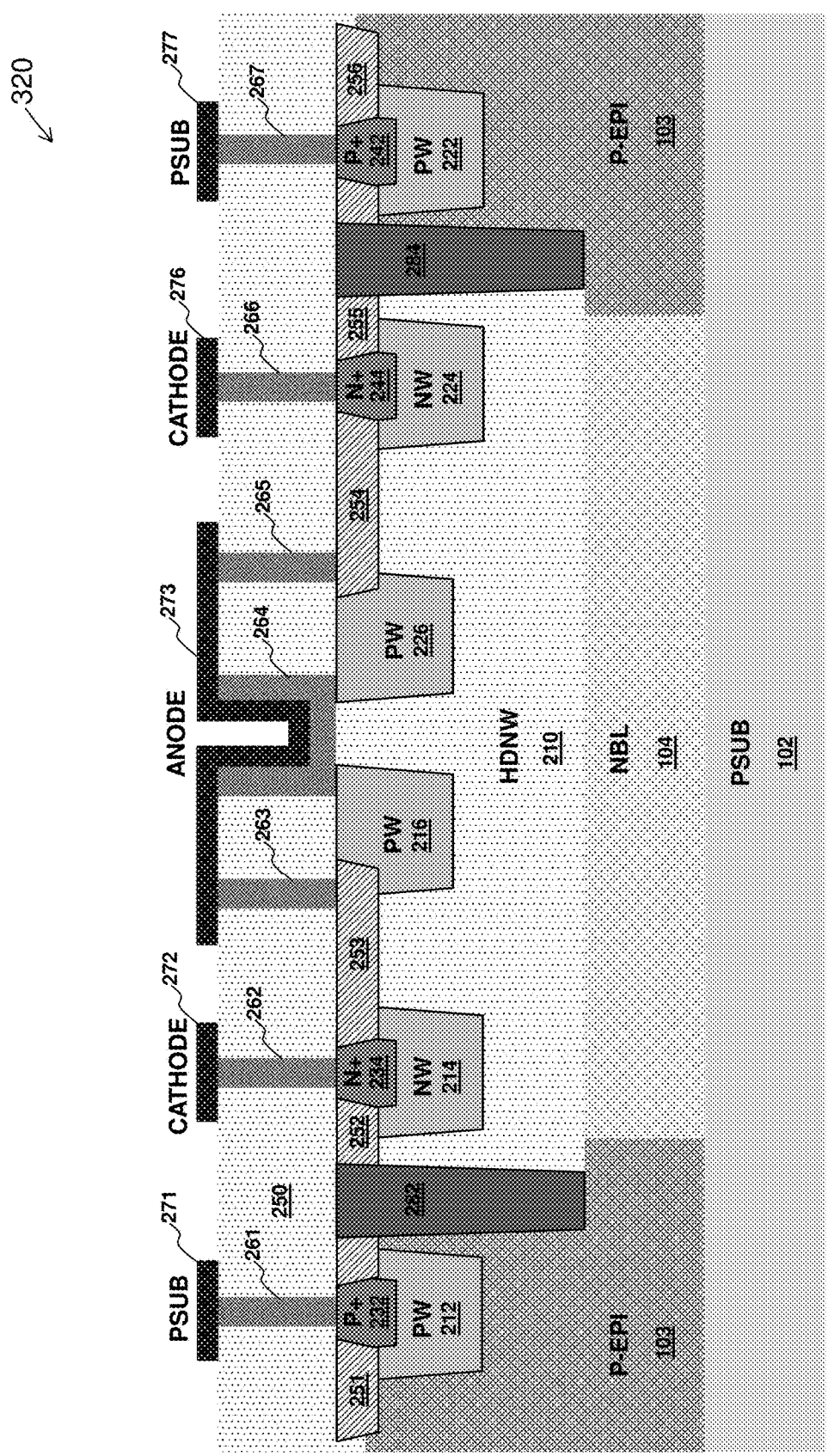
FIG. 5 illustrates a simplified cross-sectional view of the Schottky diode of the latch-up free load switch apparatus shown in FIG. 3 in accordance with various embodiments of the present disclosure.

FIG. 5 illustrates a simplified cross-sectional view of the Schottky diode of the latch-up free load switch apparatus shown in FIG. 3 in accordance with various embodiments of the present disclosure. Referring back to FIG. 1, the Schottky diodes D1 and D2 may be formed by a semiconductor structure shown in FIG. 5. The substrate 102, the epitaxial layer 103 and the buried layer 104 are similar to those shown in FIG. 4, and hence are not discussed herein.

As shown in FIG. 5, a high density N-type well (HDNW) is formed over the buried layer 104 and between two deep trench isolation regions 282 and 284. A first P-type well 216 and a second P-type well 226 are formed in the HDNW 210. A metal contact is formed over the P-type wells and the HDNW 210. As shown in FIG. 5, the metal contact comprises a lower portion 264 and an upper portion 273. A center portion of the metal contact is in contact with the HDNW 210. An edge portion of the metal contact is in contact with the P-type wells 216 and 226. FIG. 5 further shows the metal contact is connected to contact plugs 263 and 265. The metal contact and the N-type region (e.g., HDNW 210) form a metal-semiconductor junction. The Schottky diode is formed based on the metal-semiconductor junction. The P-type wells 216 and 226 help to form the metal-semiconductor junction of the Schottky diode.

FIG. 5 further shows the HDNW 210 is coupled to a first cathode terminal 272 through an N-type well 214, an N+ region 234 and a contact plug 262. The HDNW 210 is coupled to a second cathode terminal 276 through an N-type well 224, an N+ region 244 and a contact plug 266.

The upper portion 273 of the metal contact functions as an anode terminal of the Schottky diode. When D1 shown in FIG. 1 is implemented as a Schottky diode shown in FIG. 5, the first cathode terminal 272 and the second cathode terminal 276 are coupled together and future coupled to the isolation ring. The anode (e.g., metal contact 273) of the Schottky diode is coupled to the substrate.

FIG. 5 further shows the substrate 102 is coupled to a first substrate contact terminal 271 through the epitaxial layer 103, a P-type well 212, a P+ region 232 and a contact plug 261. The substrate 102 is also coupled to a second substrate contact terminal 277 through the epitaxial layer 103, a P-type well 222, a P+ region 242 and a contact plug 267.

FIG. 5 further illustrates a plurality of STI regions 251, 252, 253, 254, 255 and 256. The STI regions are employed to prevent leakage currents flowing between adjacent semiconductor regions.

Figure 6:
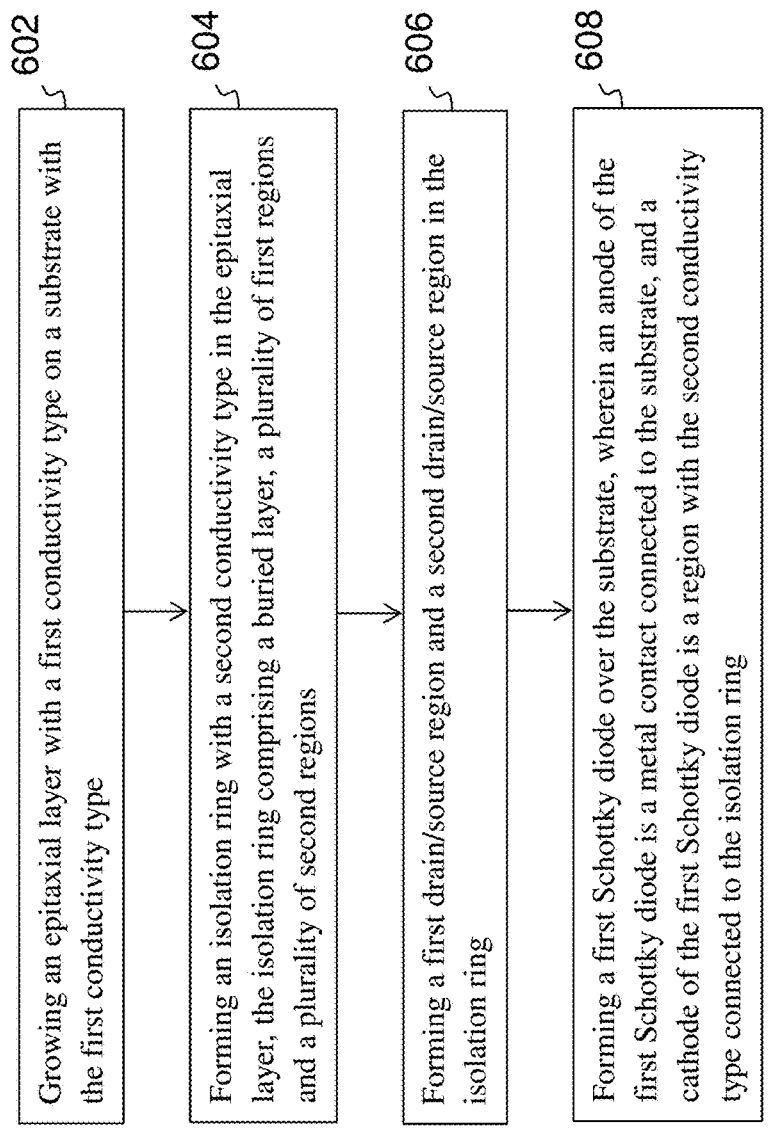
FIG. 6 illustrates a flow chart of a method for forming the load switch shown in FIG. 1 in accordance with various embodiments of the present disclosure.

FIG. 6 illustrates a flow chart of a method for forming the load switch shown in FIG. 1 in accordance with various embodiments of the present disclosure. This flowchart shown in FIG. 6 is merely an example, which should not unduly limit the scope of the claims. One of ordinary skill in the art would recognize many variations, alternatives, and modifications. For example, various steps illustrated in FIG. 6 may be added, removed, replaced, rearranged and repeated.

Referring back to FIG. 1, the load switch comprises two back-to-back connected N-type transistors. A first transistor comprises a first drain, a first gate and a first source. A second transistor comprises a second drain, a second gate and a second source. The sources of these two N-type transistors are directly connected to each other as shown in FIG. 1. The first drain of the first transistor may be connected to a terminal of a receiver coil. The second drain of the second transistor may be connected to a receiver circuit. The load switch is able to achieve bidirectional current blocking between the receiver coil and the receiver circuit. The load switch may be fabricated through the following steps.

At step 602, an epitaxial layer with a first conductivity type is grown on a substrate with the first conductivity type.

At step 604, an isolation ring with a second conductivity type is formed in the epitaxial layer. The isolation ring comprises a bottom, a first sidewall and a second sidewall. The bottom is a buried layer (e.g., layer 104 shown in FIG. 4). The first sidewall comprises a plurality of first regions (e.g., regions 132, 134 and 136 shown in FIG. 4). The second sidewall comprises a plurality of second regions (e.g., regions 142, 144 and 146 shown in FIG. 4).

In some embodiments, the first conductivity type is P-type. The second conductivity type is N-type.

At step 606, for a single transistor, a first drain/source region and a second drain/source region are formed in the isolation ring. Alternatively, for a load switch, a first drain/source region (e.g., region 124 shown in FIG. 4), a second drain/source region (e.g., region 128 shown in FIG. 4) and a third drain/source region (e.g., region 122 shown in FIG. 4) are formed in the isolation ring.

At step 608, a first Schottky diode (e.g., Schottky diode shown in FIG. 5) is formed over the substrate. An anode of the first Schottky diode is a metal contact connected to the substrate through a first semiconductor interconnect device. A cathode of the first Schottky diode is an N-type region connected to the isolation ring through a second semiconductor interconnect device.

Referring back to FIG. 4, the method further comprises forming a deep well having the first conductivity type within the isolation ring, forming a first drift layer having the second conductivity type in the deep well, forming a second drift layer having the second conductivity type in the deep well, forming a body region with the first conductivity type in the deep well, implanting ions with the second conductivity type to form the first drain/source region and the second drain/source region in the first drift layer and the second drift layer, respectively, implanting ions with the second conductivity type to form the third drain/source region in the body region, forming a first gate between the first drain/source region and the third drain/source region, and forming a second gate between the second drain/source region and the third drain/source region.

Referring back to FIG. 5, the method further comprises forming an N-type well over the buried layer, forming a plurality of P-type wells in the N-type well, and forming a metal contact over the P-type well, wherein a center portion of the metal contact is in contact with the N-type well, and an edge portion of the metal contact is in contact with the plurality of P-type wells.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a first drain/source region, a second drain/source region and a third drain/source region formed inside a well region having a first conductivity type, wherein the well region is surrounded by an isolation ring having a second conductivity type, wherein the isolation ring is floating, and the second drain/source region is formed in a body region and between the first drain/source region and the third drain/source region, and wherein the second drain/source region and the body region have two different conductivity types;
a buried layer having the second conductivity type formed between the well region and a substrate having the first conductivity type, wherein the buried layer is part of the isolation ring, and the substrate is in direct contact with the isolation ring and located below and outside of the isolation ring, while the well region is within the isolation ring;
a third diode formed between the substrate and the buried layer, wherein an anode of the third diode is connected to the substrate and a cathode of the third diode is connected to the buried layer; and
a first diode, wherein the first diode is a Schottky diode, and wherein an anode of the Schottky diode is a metal contact connected to a metal contact of the substrate through a suitable semiconductor interconnect device and a cathode of the Schottky diode is a region having the second conductivity type, and wherein the region is connected to the buried layer, and wherein:
the cathode of the Schottky diode is an N-type region, and wherein:
a first P-type well is formed in the N-type region; and
a second P-type well is formed in the N-type region, and wherein:
a portion of the N-type region between the first P-type well and the second P-type well is in direct contact with a the metal contact of the Schottky diode;
the metal contact of the Schottky diode comprises an upper portion and a lower portion, and three sides of the upper portion is surrounded by the lower portion;
a rightmost edge of the first P-type well is vertically aligned with a first sidewall of the upper portion; and
a leftmost edge of the second P-type well is vertically aligned with a second sidewall of the upper portion.

2. The apparatus of claim 1, further comprising:
a first gate formed between the first drain/source region and the second drain/source region; and
a second gate formed between the second drain/source region and the third drain/source region, wherein:

the first drain/source region, the second drain/source region, the third drain/source region, the first gate and the second gate form two back-to-back connected transistors;

the first drain/source region is a first drain of the two back-to-back connected transistors;

the second drain/source region is a common source of the two back-to-back connected transistors; and the third drain/source region is a second drain of the two back-to-back connected transistors.

3. The apparatus of claim 1, further comprising:
a second diode connected between the substrate and ground, wherein the second diode is a Schottky diode; and
a resistor connected in parallel with the second diode.

4. The apparatus of claim 3, wherein:
an anode of the second diode is connected to the substrate; and
a cathode of the second diode is connected to ground.

5. The apparatus of claim 3, wherein:
the resistor is a parasitic component having a parasitic resistance value determined by a layout of the substrate.

6. The apparatus of claim 1, wherein:
the suitable semiconductor interconnect device comprises a plurality of metal lines and vias.

7. The apparatus of claim 1, further comprising:
an epitaxial layer having the first conductivity type over the substrate having the first conductivity type;
a plurality of first regions having the second conductivity type and a plurality of second regions having the second conductivity type, wherein the buried layer, the plurality of first regions and the plurality of second regions form the isolation ring;
the well region is a deep well;
a first drift layer having the second conductivity type in the deep well, wherein the first drain/source region is formed in the first drift layer;
a second drift layer having the second conductivity type in the deep well, wherein a third drain/source region is formed in the second drift layer; and
the body region having the first conductivity type formed in the deep well and between the first drift layer and the second drift layer, wherein the second drain/source region is formed in the body region.

8. The apparatus of claim 7, wherein:
the first conductivity type is P-type; and
the second conductivity type is N-type.

9. The apparatus of claim 7, further comprising:
a fourth diode formed between the buried layer and the deep well, wherein an anode of the fourth diode is connected to the deep well and a cathode of the fourth diode is connected to the buried layer;
a fifth diode formed between the body region and the first drift layer, wherein an anode of the fifth diode is connected to the body region and a cathode of the fifth diode is connected to the first drift layer; and
a sixth diode formed between the body region and the second drift layer, wherein an anode of the sixth diode is connected to the body region and a cathode of the sixth diode is connected to the second drift layer.

10. The apparatus of claim 1, wherein:
the Schottky diode is arranged to prevent the apparatus from entering a latch-up operating condition.

11. A load switch comprising:
a first transistor; and
a second transistor being back-to-back connected to the first transistor, wherein:
a drain of the first transistor, a drain of the second transistor and a shared source are formed in a well region and within an isolation ring, wherein the isolation ring is floating, and wherein the shared source is formed in a body region, and between the drain of the first transistor and the drain of the second transistor, and wherein the shared source and the body region have two different conductivity types, and wherein the isolation ring comprises a bottom comprising a buried layer, a first sidewall and a second sidewall, and wherein the first sidewall comprises a first high density N-type well rectangular in shape, a first N-type well formed in the first high density N-type well, and a first N+ region trapezoidal in shape and formed in the first N-type well, and wherein a lower portion of the first N-type well is trapezoidal in shape, and the second sidewall comprises a second high density N-type well rectangular in shape, a second N-type well formed in the second high density N-type well, and a second N+ region trapezoidal in shape and formed in the second N-type well, and wherein a lower portion of the second N-type well is trapezoidal in shape;
the buried layer formed between the well region and a substrate, wherein the buried layer is part of the isolation ring and the substrate is in direct contact with the isolation ring and located below and outside of the isolation ring, while the well region is within the isolation ring;
a third diode formed between the substrate and the buried layer, wherein an anode of the third diode is connected to the substrate and a cathode of the third diode is connected to the buried layer; and
a first Schottky diode, and wherein an anode of the first Schottky diode is a metal contact connected to a metal contact of the substrate through a suitable semiconductor interconnect device, and a cathode of the first Schottky diode is a region connected to the buried layer.

12. The load switch of claim 11, wherein:
the region of the first Schottky diode is an N-type region; and
the suitable semiconductor interconnect device comprises a plurality of metal lines and vias.

13. The load switch of claim 11, further comprising:
a second Schottky diode connected between the substrate and ground, wherein:
an anode of the second Schottky diode is connected to the substrate; and
a cathode of the second Schottky diode is connected to ground; and
a resistor connected in parallel with the second Schottky diode, wherein the resistor is a parasitic component having a parasitic resistance value determined by a layout of the substrate.

14. The load switch of claim 11, wherein:
the substrate is connected to a ground plane through a plurality of P-type regions and a plurality of interconnect devices.

15. The load switch of claim 14, wherein:
the plurality of P-type regions and the plurality of interconnect devices are arranged such that a parasitic resistance from the substrate to the ground plane is greater than 1 Kilo-ohms.

16. The load switch of claim 11, further comprising:
a first drift layer in the well region, wherein the drain of the first transistor is formed in the first drift layer and the well region is a deep well;
a first shallow trench isolation region formed in the first drift layer;
a second drift layer, wherein the drain of the second transistor is formed in the second drift layer;
a second shallow trench isolation region formed in the second drift layer;
the body region formed in the deep well and between the first drift layer and the second drift layer;
a first gate formed between the drain of the first transistor and the shared source; and
a second gate formed between the drain of the second transistor and the shared source.

17. The load switch of claim 16, wherein:
a first portion of a bottom surface of the first gate is over and in direct contact with the first shallow trench isolation region;
a second portion of the bottom surface of the first gate is over and in direct contact with the first drift layer;
a third portion of the bottom surface of the first gate is over and in direct contact with the deep well; and
a fourth portion of the bottom surface of the first gate is over and in direct contact with the body region, and wherein a rightmost edge of the fourth portion of the bottom surface of the first gate is vertically aligned with a leftmost edge of the shared source.

\* \* \* \* \*